United States Patent [19]
Shenoy

[11] Patent Number: 5,822,217
[45] Date of Patent: *Oct. 13, 1998

[54] METHOD AND APPARATUS FOR IMPROVING CIRCUIT RETIMING

[75] Inventor: Narendra V. Shenoy, Milpitas, Calif.

[73] Assignee: Synopsys, Inc., Mountain View, Calif.

[21] Appl. No.: 578,961

[22] Filed: Dec. 27, 1995

Related U.S. Application Data

[60] Provisional application No. 60/008,597 Dec. 13, 1995.
[51] Int. Cl.⁶ .................................................. G06F 17/50
[52] U.S. Cl. ......................... 364/488; 364/489; 364/490
[58] Field of Search .................................. 364/488–491,
364/578; 375/357; 348/497

[56] References Cited

U.S. PATENT DOCUMENTS

| | | | |
|---|---|---|---|
| 5,448,497 | 9/1995 | Ashar et al. ............................. | 364/489 |
| 5,544,066 | 8/1996 | Rostoker et al. ....................... | 364/489 |
| 5,553,000 | 9/1996 | Dey et al. ............................... | 364/488 |
| 5,555,188 | 9/1996 | Chakradhar ............................ | 364/490 |

OTHER PUBLICATIONS

Martin ("Retiming by combination of relocation and clock delay adjustment", IEEE Comput. Soc. Press, Proceedings EURO–DAC, European Design Automation Conference with EURO–VHDL 1993, pp. 384–389), Sep. 20, 1993.

Soyata et al. ("Monotonicity constraints on path delays for efficient retiming with localized clock skew and variable register delay", IEEE Symposium on Circuits and Systems, 28 Apr.–3 May 1995 Conference, pp. 1748–1751), Apr. 28, 1995.

Soyata et al. ("Integration of clock skew and register delays into a retiming algorithm", IEEE, Proceedings of 1993 IEEE International Symposium on Circuits and Systems, May 3–6, 1993, pp. 1483–1486), May 3, 1993.

De Micheli, ("Synchronous Logic Synthesis: Algorithms for Cycle–Time Minimization", IEEE Transactions on Computer–Aided Design, vol. 10, No. 1, pp. 63–73), Jan. 1991.

Soyata et al. ("Synchronous performance and reliability improvement in pipelined ASICs", IEEE Proceedings: Seventh Annual IEEE International ASIC Conference and Exhibit, 19–23 Sep. 1994, pp. 383–390).

Article by Shenoy et al., entitled "Efficient Implementation of Retiming" pp. 1–20, publication date unknown.

*Primary Examiner*—Emanuel Todd Voeltz
*Assistant Examiner*—Phallaka Kik
*Attorney, Agent, or Firm*—Graham & James LLP

[57] ABSTRACT

A method and apparatus for improving the retiming of a circuit. The invention "tricks" a conventional retiming engine so that the retiming engine will correctly and consistently retime the circuit. Specifically, the present invention adjusts gate delays to account for the fact that registers in the circuit may be moved during retiming. The present invention also includes a methodology for choosing a preferred register from a technology library. Lastly, the present invention also adjusts the clock period of the circuit to account for the fact that the retiming engine assumes a clock-to-state of registers in the circuit to be zero when this is not always the case.

20 Claims, 8 Drawing Sheets

FIG. 5
Determining a Preferred Flip-flop

FIG. 9 ns a methodology for choosing a single type of flip-flop to be used for all registers of the circuit. The present invention further adjusts the clock period of the circuit representation sent to the retiming engine in order to compensate for certain nonrealistic assumptions made by the retiming engine. After adjustments in accordance with the present invention have been made to the circuit representation, the circuit representation is then input to a conventional retiming engine.

METHOD AND APPARATUS FOR IMPROVING CIRCUIT RETIMING

Applicant claims benefit under 35 U.S.C. § 119 (e) of U.S. Provisional patent application Ser. No. 60/008,597, entitled "METHOD AND APPARATUS FOR IMPROVING CIRCUIT RETIMING," filed Dec. 13, 1995.

BACKGROUND OF THE INVENTION

This application relates to a method and apparatus for logic circuit synthesis, and more particularly, to a method and apparatus for improving retiming of circuit representations during logic circuit synthesis.

Logic circuit synthesis is a process in which a computer program aids human beings in designing electrical circuits. At the beginning of the process, a circuit designer specifies a circuit at a high level of abstraction using a high level design specification language, such as Verilog or VHDL. The abstract circuit representation of the circuit is transformed into a gate-level circuit representation by a computer program, such as HDL Compiler, available from Synopsys, Inc. of Mountain View, Calif.

Logic circuit synthesis software transforms the gate-level circuit representation to an abstract "netlist" representation. After the netlist representation has been generated, the synthesis software attempts to optimize the netlist circuit representation. The optimization makes the circuit representation more compact and more efficient. Part of the optimization process is known as "retiming."

During this optimization process, conventional retiming software called a "retiming engine" moves selected elements of the circuit representation to increase the efficiency and compactness of the circuit. Specifically, the retiming engine repositions the "registers" in the circuit representation, leaving combinational logic cells, such as AND gates and OR gates, untouched. The purpose of repositioning the registers in the circuit is to improve the timing of the circuit and/or to reduce the number of registers required in the circuit.

For efficacy and tractability, the retiming engine uses a simplistic delay model for gates. Each gate in the netlist representation is assigned a real number that reflects the units of time required for the logic of the gate to complete computation. In actual circuits, the repositioning of registers during retiming, can cause the "load" of a particular gate to change. Load of a gate is affected by the number and type of elements driven by the gate. A change in the load of a gate can cause the delay of a gate to change. After retiming, gate delays for an individual gate can be incorrect if the load of the gate changed during retiming. Thus, assignment of a constant value as a gate delay in the retiming engine can lead to incorrect retiming results.

A "clock-to-state delay" is the amount of time elapsed between a clock transition to the register and stabilization of a register output. In conventional logic synthesis, many conventional retiming engines assume that registers in the circuit have a "clock-to-state delay" of zero. In the real world, this assumption is not always true.

SUMMARY OF THE INVENTION

The present invention overcomes the problems and disadvantages of the prior art by adjusting the gate delays of a circuit representation before it is sent to a retiming engine. The adjusted gate delay accounts for the fact that registers may be moved within the circuit representation during the retiming process. In addition, the present invention implements a methodology for choosing a single type of flip-flop to be used for all registers of the circuit. The present invention further adjusts the clock period of the circuit representation sent to the retiming engine in order to compensate for certain nonrealistic assumptions made by the retiming engine. After adjustments in accordance with the present invention have been made to the circuit representation, the circuit representation is then input to a conventional retiming engine.

Most customers are willing to accept retiming as long as the retiming engine yields results that are conservative and consistent. The present invention is consistent because it causes successive retimings of a circuit to yield the same solution. The conventional method of retiming circuits does not have this property. The present invention is conservative because any solution it yields will satisfy the constraints of either a simple delay model or a complex delay model.

In accordance with the purpose of the invention, as embodied and broadly described herein, the invention is a method of preparing a circuit representation stored in a memory for retiming, the method comprising the steps, performed by a processor of a data processing system, of: providing in the memory a gate-level circuit representation having at least one gate and at least one register and having a maximum clock period value associated with the gate-level circuit representation; adjusting a gate delay value of the gate to be a delay value for the gate that can result from retiming; and adjusting the maximum clock period value of the gate-level circuit representation by subtracting a possible clock-to-state delay for the one register that can result from retiming.

In further accordance with the purpose of this invention, as embodied and broadly described herein, the invention is a method of preparing for retiming a gate-level circuit representation stored in a memory and having a plurality of gates, a plurality of registers, the method comprising the steps, performed by a processor of a data processing system, of: for each of the plurality of gates, shorting the registers on a fanout path of the gate to create a register-shorted fanout path for the gate; sending each of the plurality of gates, with its registershorted fanout path, to a timing element, which determines an adjusted gate delay value for the gate with its register-shorted fanout path; and for each of the plurality of gates, storing the adjusted gate delay value for the gate in the memory in association with the gate.

In further accordance with the purpose of this invention, as embodied and broadly described herein, the invention is a method of preparing for retiming a gate-level circuit representation stored in a memory and having a plurality of gates, a plurality of registers, and a plurality of nets and having a maximum clock period value associated therewith, the method comprising the steps, performed by a processor of a data processing system, of: for each of the plurality of nets in the gate-level circuit, determining a worst case clock-to-state delay value for the net; determining an adjusted next-state delay value for the circuit representation in accordance with the worst case clock-to-state delay value of each of the plurality of nets; and subtracting from the maximum clock period value the adjusted clock-to-state delay value for the circuit representation to yield an adjusted clock period value.

Objects and advantages of the invention will be set forth in part in the description which follows and in part will be obvious from the description or may be learned by practice of the invention. The objects and advantages of the invention will be realized and attained by means of the elements and combinations particularly pointed out in the appended claims.

BRIEF DESCRIPTION OF THE DRAWINGS

The accompanying drawings, which are incorporated in and constitute a part of this specification, illustrate several embodiments of the invention and, together with the description, serve to explain the principles of the invention.

DETAILED DESCRIPTION OF THE PREFERRED EMBODIMENTS

Reference will now be made in detail to the preferred embodiments of the invention, examples of which are illustrated in the accompanying drawings. Wherever possible, the same reference numbers will be used throughout the drawings to refer to the same or like parts.

I. Overview

Figure 1:
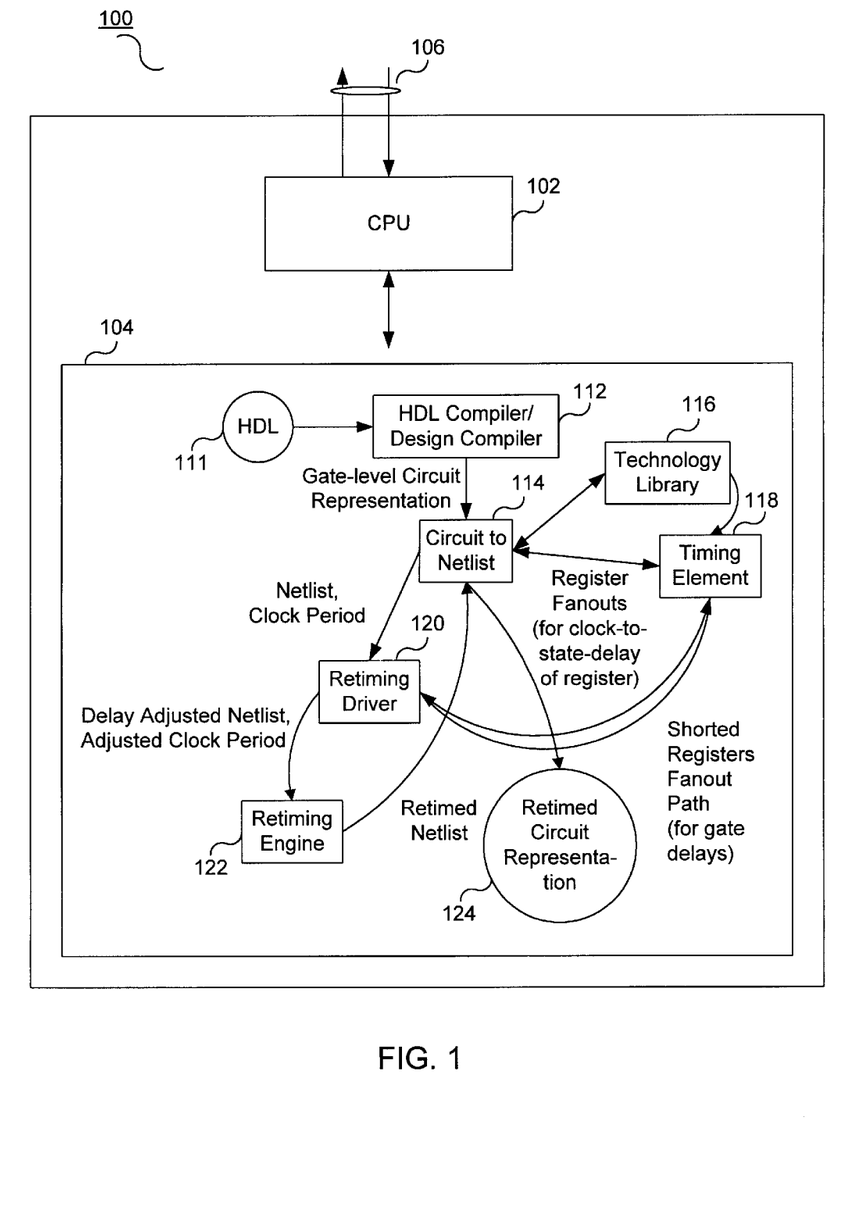
FIG. 1 is a block diagram of a computer system in accordance with the present invention.

FIG. 1 is a block diagram of a computer system 100 in accordance with the present invention. Computer system 100 includes a CPU 102, a memory 104, and input/output lines 106. It will be understood by a person of ordinary skill in the art that computer system 100 can also include numerous elements not shown in the Figure for the sake of clarity, such as disk drives, keyboards, display devices, network connections, additional memory, additional CPUs, etc.

Memory 104 includes a circuit synthesis software program, a portion of which is shown in the Figure. The input to the synthesis program is a high-level circuit representation 111, written in a circuit specification language, such as VHDL or Verilog. High-level circuit representation 111 is input to an HDL compiler 112, which generates a gate-level circuit representation in memory 104. HDL compiler 112 can be, for example, HDL compiler and Design Compiler, available from Synopsys, Inc. of Mountain View, Calif. Alternately, a gate-level circuit representation can be input directly. In the circuit representation, the circuit is represented in terms of cells, pins, nets, etc. in a manner known to persons of ordinary skill in the art. A net is a representation of an electrical connection between one or more circuit elements.

The gate-level circuit representation is input to a circuit-to-netlist conversion element 114 that also receives input from a technology library 116 and that both sends and receives input to and from a timing element 118. Circuit-to-netlist conversion element 114 converts the gate-level circuit representation to a directed graph representation (also called a "netlist") in which the circuit is represented in terms of nodes and arcs in a manner known to persons of ordinary skill in the art. Such a conversion procedure is described in, for example, the Design time Reference Manual, p. A-4, available from Synopsys, Inc.

Timing element 118 receives a portion of the circuit representation (such as an AND gate and its outputs) from circuit-to-netlist element 114 and assigns a delay value to each gate in a manner known to persons of ordinary skill in the art. Timing element 118 can be any conventional timing element, such as Design time, which is available from Synopsys, Inc. of Mountain View, Calif. Delay calculation in Design time is further described in Appendix A of the Design time Reference Manual, available from Synopsys, Inc., the entirety of which manual is herein incorporated by reference.

After the gate-level circuit representation is transformed to a netlist, retiming driver 120 prepares the netlist for retiming. Retiming driver 120 determines a "preferred flip-flop" that will be used (at least initially) as the flip-flop for each register in the netlist representation. The method of choosing the preferred flip-flop is discussed below in conjunction with FIG. 5. Retiming driver 120 also adjusts individual gate delays and adjusts the maximum clock period, as described below. The delay adjusted netlist representation is then sent to a retiming engine 122, which performs a retiming operation as discussed below. In an alternate preferred embodiment, elements 114 and 120 may be functionally combined into a single element. Retiming engine 122 outputs a retimed netlist to circuit-to-netlist conversion element 114, which outputs a retimed circuit representation 124.

The following paragraphs discuss the retiming process performed by retiming engine 122 of FIG. 1. Retiming is an optimization technique for sequential logic circuits. The retiming process repositions the registers in a circuit leaving the combinational logic (such as AND gates and OR gates) untouched. Retiming uses the flexibility provided by repositioning the memory elements to optimize a circuit to obtain one of the following goals:

1) To obtain minimum period i.e., implementation to minimize the clock period of the circuit,
2) To obtain a minimum area, i.e., implementation to minimize the number of registers in the circuit, or
3) To obtain a constrained minimum area, i.e., implementation to minimize the number of registers in the circuit subject to a maximum length of user-specified clock period. The retiming engine indicates failure if the specified clock period cannot be achieved.

A discussion of techniques employed in retiming engine 122 can be found in Shenoy and Rudell, "Efficient Implementation of Retiming," Proceeding of ICCAD 1995; in Leiserson and Saxe "Optimizing Synchronous Systems," Journal of VLSI and Computer Systems, pp. 41–67, 1983; or in Leiserson and Saxe, "Retiming Synchronous Circuitry," Algorithmica, 1991. Each of these three documents is herein incorporated by reference. It should be understood, however, that any appropriate retiming technique can be used in conjunction with the present invention without departing from the spirit and scope of the invention.

Figure 2:
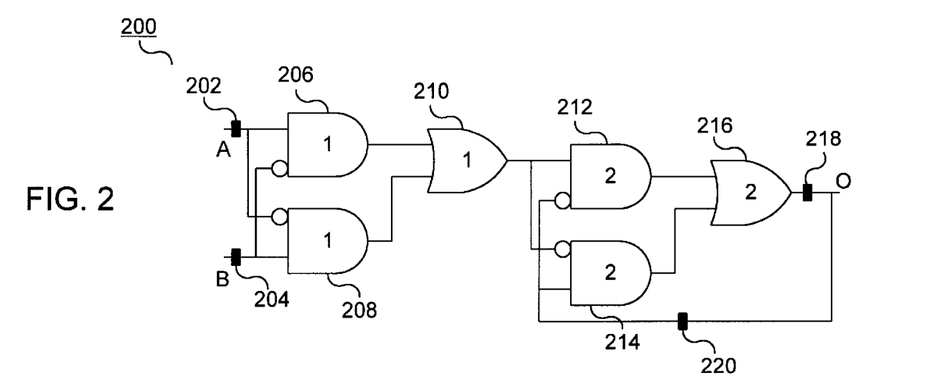
FIGS. 2–4 show examples of retiming a circuit representation.
Figure 3:
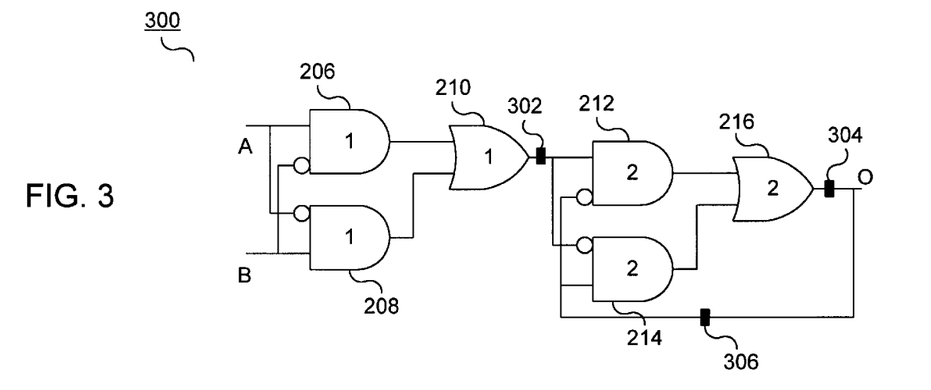
Figure 4:
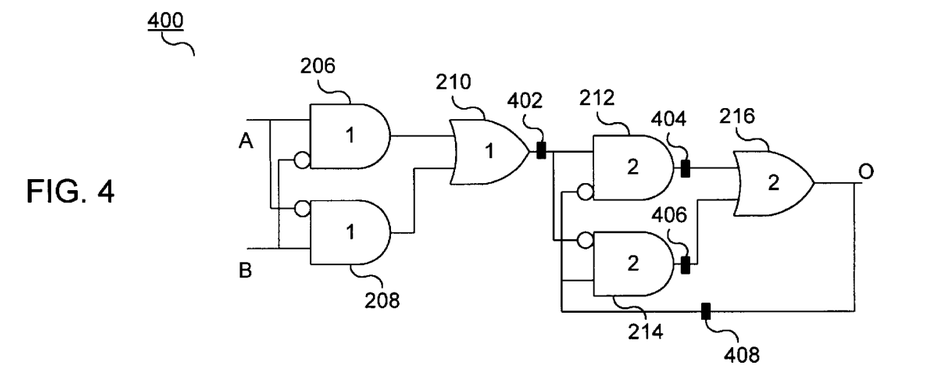

FIGS. 2–4 show examples of retiming a circuit representation stored in memory 104 during operation of retiming engine 120. The circuit representations of FIGS. 2–4 are functionally equivalent to each other, but differ in timing characteristics and number of registers. FIG. 2 shows a circuit representation 200 stored in memory 104 before retiming. Circuit representation 200 has inputs A and B and an output O. In the example, solid rectangles represent registers that are implemented as edge-triggered flip-flops. Thus, each register in the resulting circuit path will be activated by the beginning of a new clock cycle.

The following paragraph describes the circuit representation of FIG. 2 in detail. In FIG. 2, an output of register 202 is sent to a first input of an AND gate 206 and the negation of the output of register 202 is sent to a first input of an AND gate 208. The negation of an output of register 204 is sent to a second input of AND gate 206 and the output of register 204 is sent to a second input of AND gate 208. An output of AND gate 206 is sent to a first input of an OR gate 210. An output of AND gate 208 is sent to a second input of OR gate 210. An output of OR gate 210 is sent to a first input of an AND gate 212 and the negation of the output of OR gate 210 is sent to a first input of an AND gate 214. An output of AND gate 212 is sent to a first input of an OR gate 216 and an output of AND gate 214 is sent to a second input of OR gate 216. An output of OR gate 216 is sent to a register 218. An output of register 218 is sent to output o and to a register 220. The negation of an output of register 220 is then sent to a second input of AND gate 212 and the output of register 220 is further sent to a second input of AND gate 214.

In FIGS. 2–4, the gate delay of each combinational logic gate is shown printed inside the gate. (For simplicity of explanation, the gate delays of FIGS. 2–4 are shown as remaining constant before and after retiming.) Thus, for example, AND gate 206 has a gate delay of one time unit. It is assumed that a single clock signal will be used to drive the clock pins of all registers in the circuit. It is important to note that the best clock period that can be achieved for such a circuit is given by the maximum delay of a path consisting of gates between registers. Thus, the best clock period that can be achieved for the circuit of FIG. 2 is six time units (e.g., the sum of the delays of gates 206, 210, 212, and 216).

In contrast, a circuit representation 300 of FIG. 3, which is stored in memory 104 of FIG. 1, has been retimed to yield a minimum number of registers (to minimize area cost of the circuit). The retimed circuit 300 has three registers 302, 304, and 306, instead of four registers, as shown in FIG. 2. Circuit representation 300 has a best clock period of four time units (e.g., the delay of gate 212 plus the delay of gate 216). Similarly, a circuit representation 400 of FIG. 4, which also is stored in memory 104, has been retimed to yield a minimum clock period (to maximize performance of the circuit). Circuit representation 400 has four registers 402, 404, 406, and 408. These registers are positioned differently than the registers in FIGS. 2 and 3. Circuit representation 400 has a best clock period of two time units. Thus, various retiming operations can optimize for various goals, such as to save costs, to maximize performance, or to yield a circuit with a specified maximum clock period. The present invention can operate in conjunction with a retiming engine that achieves any of these goals.

II. Preferred Flip-Flop Choice

In the described embodiment of the present invention, all registers in the circuit representation initially will be assumed to be a single kind of "preferred" edge-triggered flip-flop. Technology library 116 stores characteristics associated with various types of flip-flops that are capable of being used as the preferred flip-flop. The retiming driver 120 which is embodied as instructions stored in memory 104 and executed by CPU 102, uses the steps of FIG. 5 to choose the preferred flip-flop from technology library 116 and assigns, e.g., delay values, associated with the preferred flip-flop to all registers in the circuit.

Figure 5:
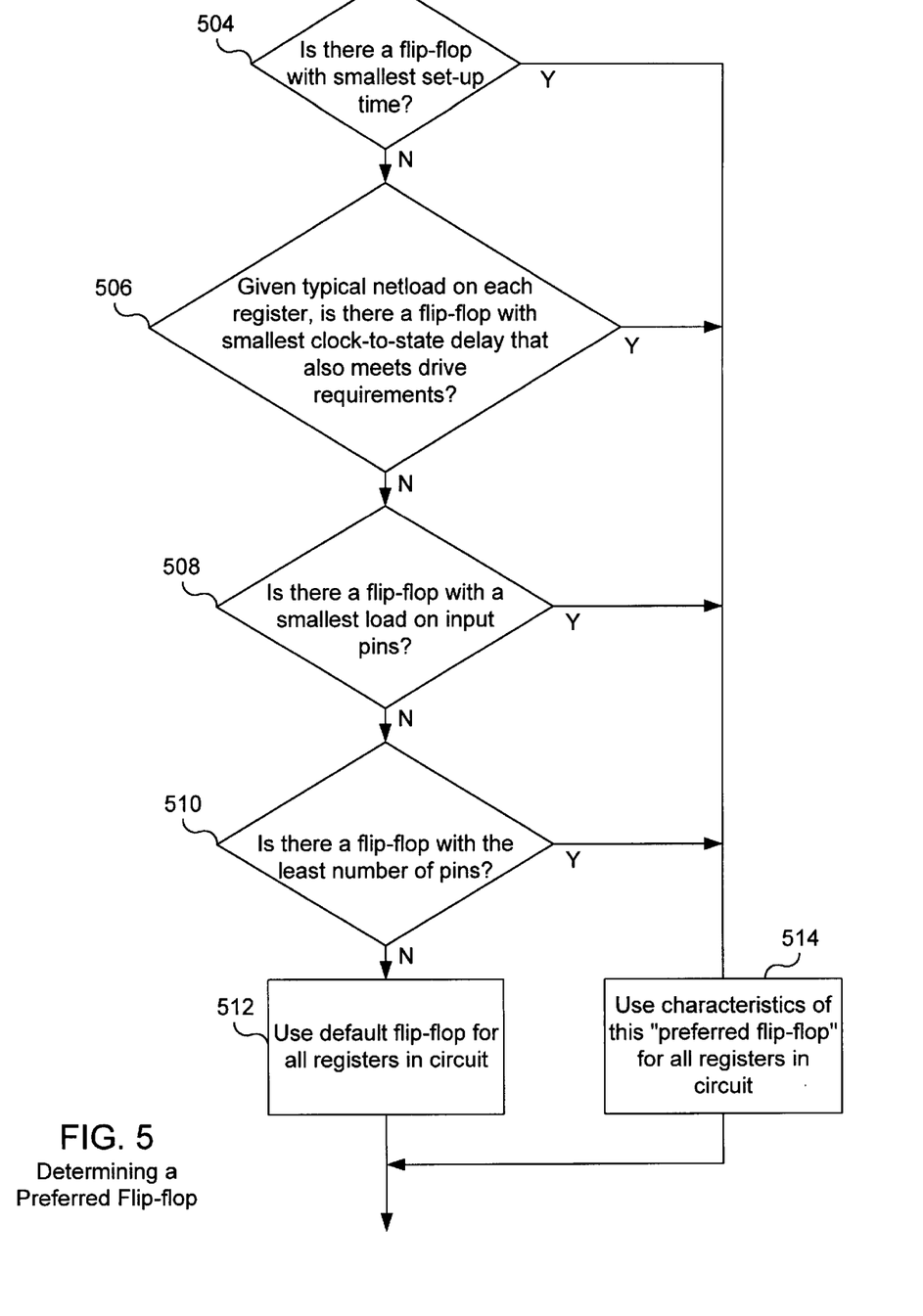
FIG. 5 is a flow chart showing steps performed in accordance with the present invention to determine a preferred flip-flop for a circuit representation.

The following paragraph describes an example of criteria used to choose a preferred flip-flop. In general, if the circuit representation has a large fanout from many gates, then the preferred flip-flop will be chosen from among flip-flops in technology library 116 that have good drivers. In step 504, a flip-flop with a smallest set-up time is chosen as the preferred flip-flop. In case of ties, element 120 determines a typical net-load for the design. Step 506, attempts to select a flip-flop with a smallest clock-to-state delay with the typical net load at the output. In case of ties, in step 508, a flip-flop with the smallest load is chosen as the preferred flip-flop. Further ties are broken in step 510, by selecting the flip-flop with a smallest number of pins as the preferred flip-flop. Lastly, in step 512, if none of the above steps yields a preferred flip-flop, a predetermined default flip-flop of the flip-flops tested is used as the preferred flip-flop for the circuit representation. For example, the flip-flop having a library name that is first in alphabetical order may be used as a default. The characteristics in technology library 116 for the preferred flip-flop are used for all registers in the circuit representation when it is sent to the retiming engine. As discussed below, a single flip-flop is assumed to be used for all registers. This assumption allows retiming driver 120 to use a single register set-up time when adjusting the clock period.

III. Adjusting the Timing Delays of Gates

Conventionally, gate delays in circuits sent to retiming engines have been constructed using gate delays obtained from a library. Unfortunately, this method does not always yield accurate or desirable retiming results. As will be understood by persons of ordinary skill in the art, the movement, deletion and addition of registers during retiming will sometimes affect the "load" of a gate and will therefore affect the transition delay ("the gate delay") of the gate in the actual circuit. The transition delay is the time required for a gate output to change logic value due to loading at the output pin, i.e., output resistance times load. For example, removing registers from a circuit path during retiming (see FIGS. 2–4) will change the load on the gate and will change the gate delay. A delay of a gate is determined not by a number of fanout elements, but by the nature of the gates actually on its fanout path. Use of a predetermined gate delay during retiming without considering the load of the gate can cause inaccurate gate delay values to be assigned to gates.

Figure 6:
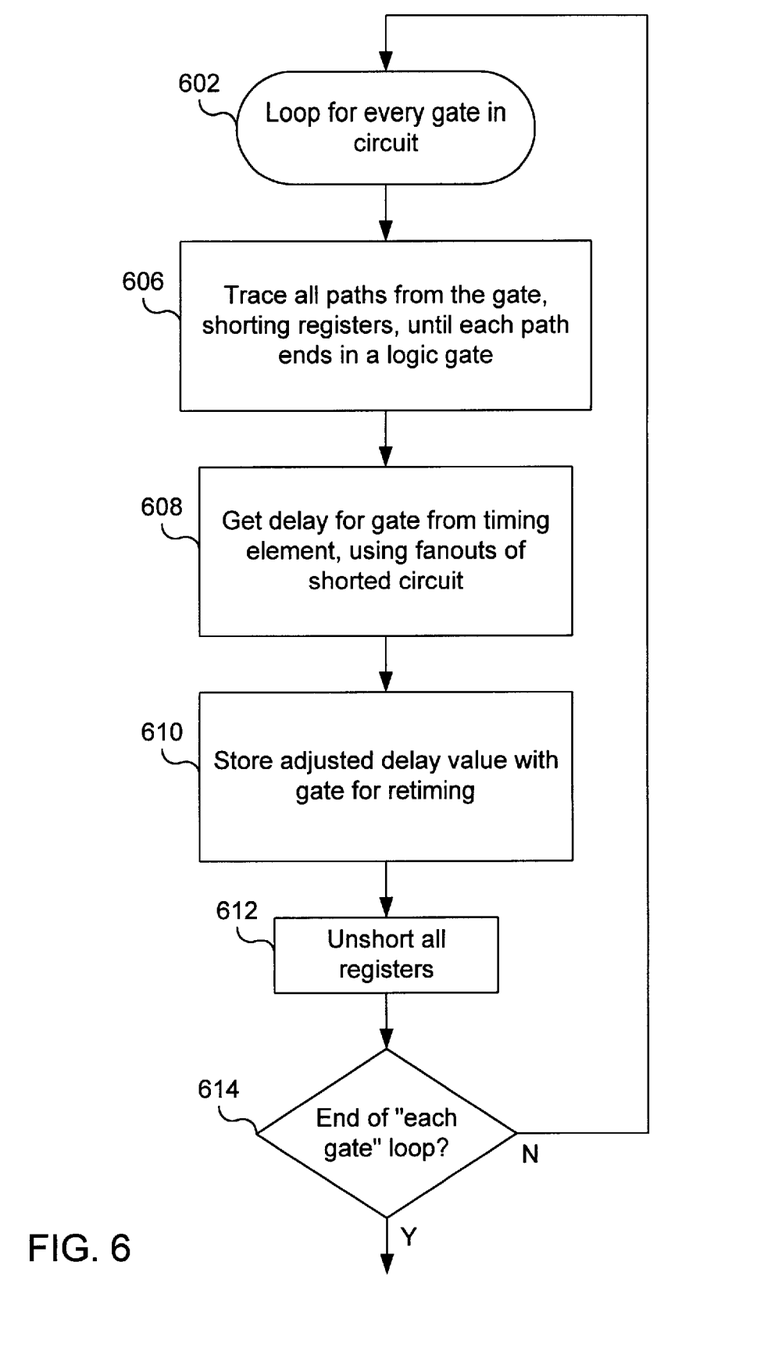
FIG. 6 is a flow chart showing steps performed in accordance with the present invention to adjust the gate delays of gates in a circuit representation before the circuit representation is retimed.

The present invention assigns the timing delays of individual gates in a circuit representation before retiming so that the retiming results yielded by the engine are correct. FIG. 6 is a flow chart showing steps performed by retiming driver 120 of FIG. 1 to adjust the delays of gates in a netlist circuit representation before the circuit representation is retimed. Although the example shown below discusses adjusting a gate delay of a single gate, the steps discussed below preferably are performed for each gate in the circuit before the circuit is retimed.

It will be understood that the steps of FIG. 6 are performed by retiming driver 120 of FIG. 1, which is embodied as instructions stored in memory 104 and executed by CPU 102. In alternative embodiments, other software elements could perform the steps of FIG. 6. An important aspect of these steps are that they are performed before the circuit representation is input to retiming engine 122. Thus, the steps of FIG. 6 compensate for possible changes that retiming engine 122 may make to the circuit representation.

Step 602 indicates that the following steps are performed for each logic gate in the circuit representation to be retimed.

Figure 7:
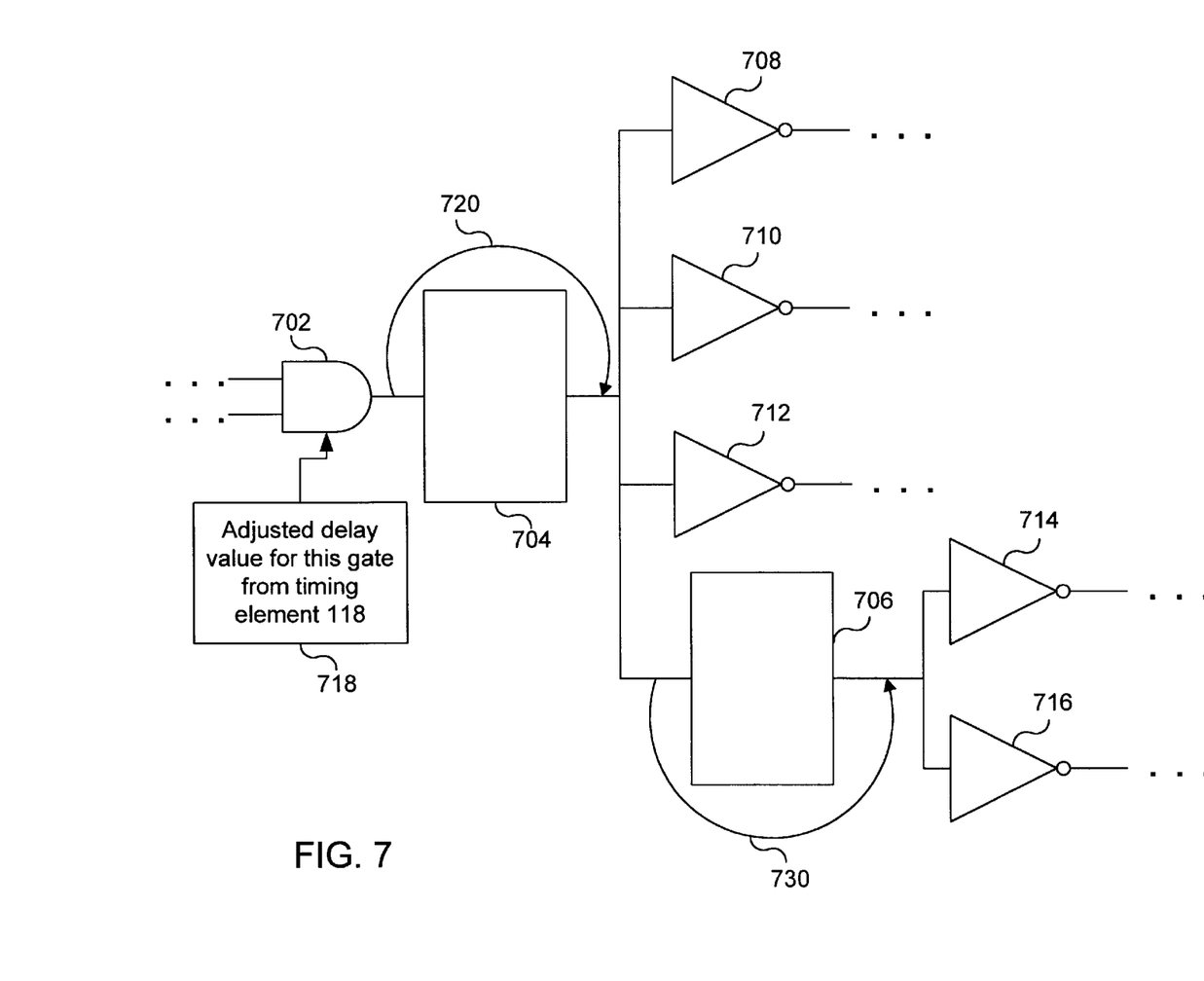
FIG. 7 is a diagram showing register shorting in accordance with the present invention.
Figure 8A:
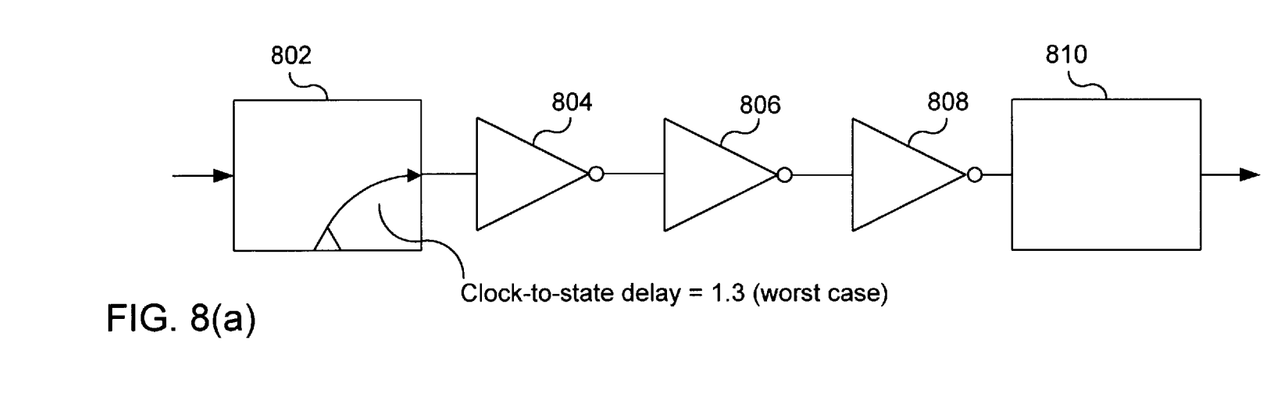
FIGS. 8(a) through 8(d) are diagrams showing calculation of various clock-to-state delays for a register in a circuit representation.
Figure 8B:
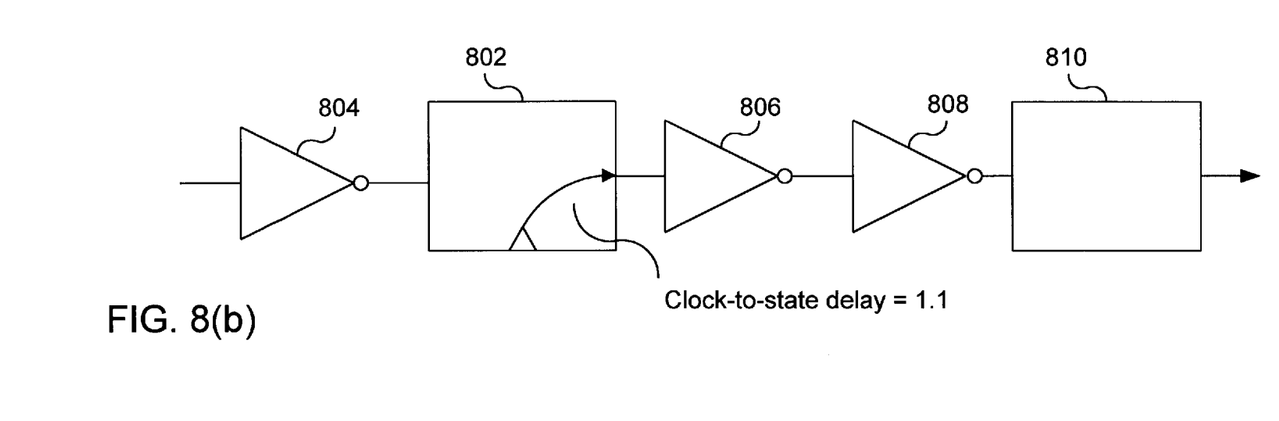
Figure 8C:
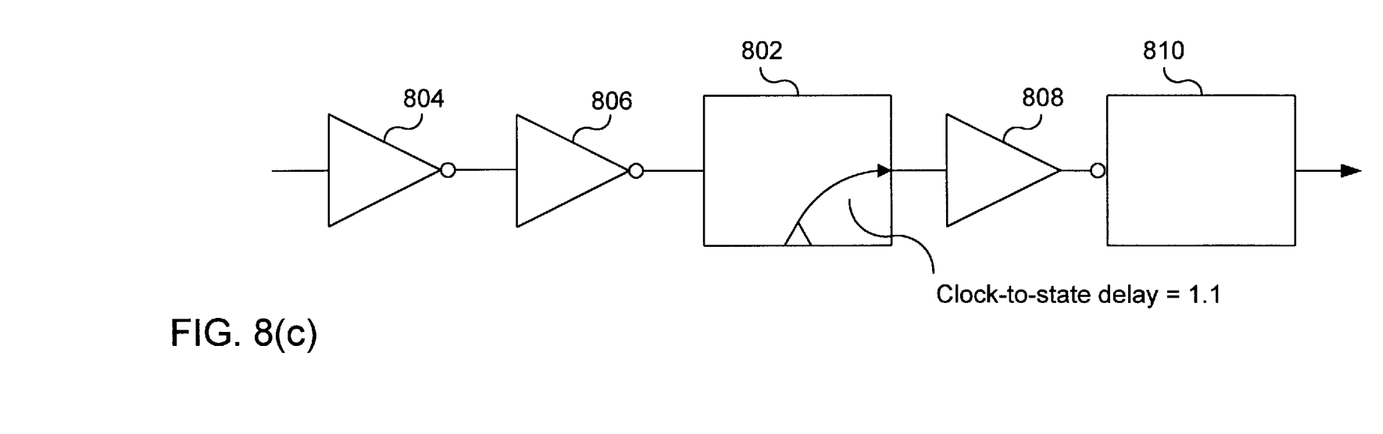
Figure 8D:
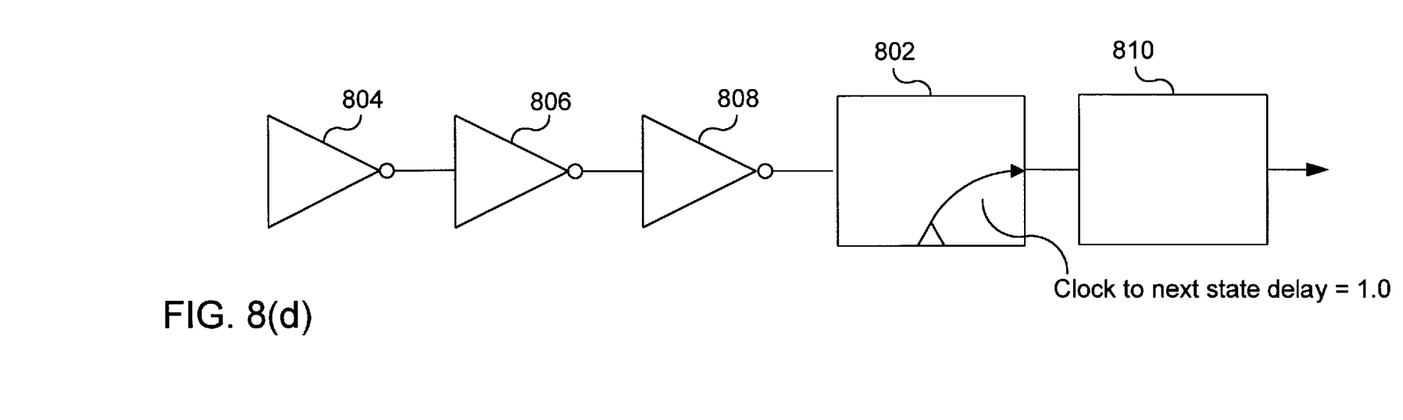

Step 606 indicates that retiming driver 120 recursively follows all outputs of the current logic gate until another logic gate is reached on each branch. As shown in FIG. 7, if a register is discovered on a branch of the fanout path, the register is "shorted" (temporarily removed from the circuit) in a manner known to persons of ordinary skill in the art. After step 606, all registers on the fanout path for the current gate have been temporarily shorted and all fanout paths for the current gate end in a gate. In step 608, the gate and its fanout with shorted registers is sent to timing element 118 to be timed. In step 610, the adjusted delay value is stored in association with the gate in memory 104. The registers in the circuit representation are "unshorted" in step 612.

Thus, in the present invention, a gate delay is determined for each gate by following the fanout of the gate, shorting registers until a gate is found on each fanout path and then sending the gate and its shorted fanout to the timing element 118.

FIG. 7 is a diagram showing register shorting in accordance with the present invention. The portion of the circuit representation sent to timing element 118 includes a logic circuit having gates 702, 708, 710, 712, 714, and 716. Alternate paths 720 and 730 short registers 704 and 706. It should be apparent to persons of ordinary skill in the art that the portion of the circuit shown in FIG. 7 usually has a higher load on gate 702 when registers 704 and 706 are shorted. As will be understood by persons of ordinary skill in the art, gate delay is proportional to load. As shown for gate 702 in FIG. 7, the adjusted gate delay 718 for each gate is stored as a part of the circuit representation in memory before the circuit representation is sent to retiming engine 122. Thus, each gate has an associated adjusted delay that is pessimistic delay for the gate.

IV. Adjusting the Maximum Clock Period of the Circuit

A conventional retiming engine 122 used in conjunction with the present invention assumes that a delay at a "next state" pin of each register is zero. As discussed above, the load at the output of a register affects its clock-to-state delay.

FIG. 8 shows an example of a circuit representation in which the clock-to-state delay of register 802 is greater than zero. Specifically, because register 802 has a set-up time and because register 802 is driving a load including one of gates 804, 806, or 808 its clock-to-state delay will actually be greater than zero. A set-up time is an amount of time before the arrival of the clocking signal for which the input data must be stable. As discussed above, retiming engine 122 assumes a clock-to-state delay of zero. The present invention compensates for the assumption of the timing engine, with respect to the clock-to-state delay, by adjusting the clock period sent to retiming engine 122. As discussed above, retiming engine 122 may seek to minimize the number of registers in the circuit, subject to a maximum length of the clock period. Thus, the present invention sends a clock period to the retiming engine that is less than the target clock period specified by the user. As a result of this decreased maximum clock period, the incorrect assumption of the retiming engine concerning the clock-to-state delay will not matter.

Figure 9:
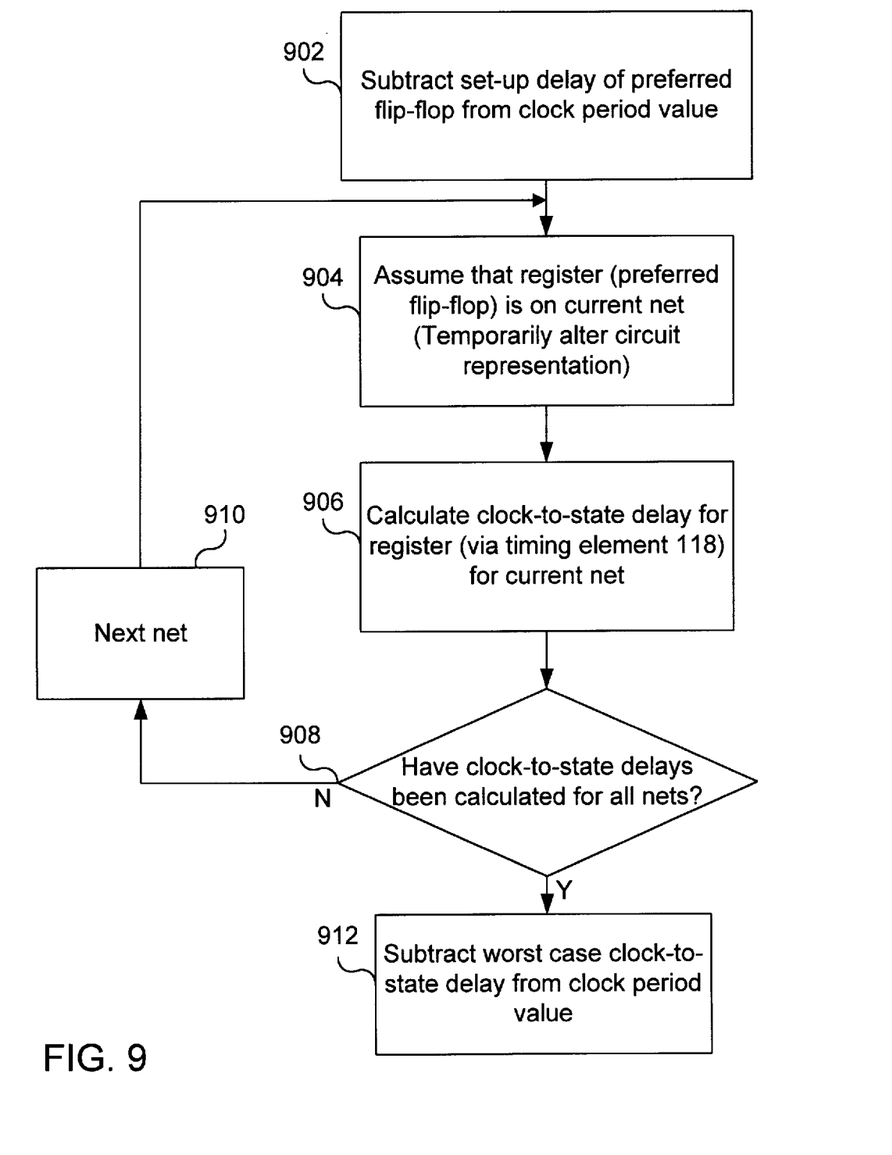
FIG. 9 is a flow chart showing steps performed in accordance with the present invention to adjust the maximum clock period of a circuit representation before the circuit is retimed.

FIG. 9 shows a flow chart of steps performed by retiming driver 120 (using timing element 118) to adjust the maximum clock period value for the circuit. In step 902, a set-up time for the preferred flip-flop is subtracted from the maximum clock period value for the circuit representation. Steps 904–910 place a register (the preferred flip-flop) on each net and determine a clock-to-state delay for the register. In steps 904–910, as shown in FIGS. 8(*b*)–8(*d*), the clock-to-state delay for each register in each possible position is timed using timing element 118. Step 912 subtracts the worst case clock-to-state delay for the preferred register for all nets from the maximum clock period value. In an alternate embodiment, an average clock-to-state delay of all the registers is subtracted.

In summary, the present invention is a method and apparatus for retiming a circuit. The described embodiment uses a conventional retiming engine that does not take certain facts into account. The present invention "tricks" the retiming engine so that the retiming engine will correctly and consistently retime the circuit. Specifically, the present invention adjusts gate delays of the circuit to account for the fact that registers in the circuit may be moved during retiming. The present invention also includes a methodology for choosing a preferred flip-flop from a technology library. Lastly, the present invention also adjusts the clock period of the circuit to account for the fact that the retiming engine assumes a clock-to-state delay of registers in the circuit representation to be zero, although this assumption is not always true in an actual physical circuit.

Other embodiments will be apparent to those skilled in the art from consideration of the specification and practice of the invention disclosed herein. It is intended that the specification and examples be considered as exemplary only, with a true scope of the invention being indicated by the following claims.

What is claimed is:

1. A method of preparing a circuit representation stored in a memory for retiming, the method comprising the steps, performed by a processor of a data processing system, of:

providing in the memory a gate-level circuit representation having at least one gate and at least one register and having a maximum clock period value associated with the gate-level circuit representation;

adjusting, prior to retiming, a gate delay value of the gate to be a delay value for the gate that can result from retiming; and adjusting, prior to retiming, the maximum clock period value of the gate-level circuit representation by subtracting from the maximum clock period value a possible clock-to-state delay for the register that can result from retiming.

2. The method of claim 1, further comprising the step of retiming the gate-level circuit representation in accordance with the adjusted maximum clock period value.

3. The method of claim 1, further comprising the step of retiming the gate-level circuit representation in accordance with the adjusted gate delay value of the gate.

4. The method of claim 1, wherein the step of adjusting the gate delay value of the gate includes the steps of shorting the register in the gate-level circuit representation and sending the gate and its shorted circuit fanout path to a timing engine to be timed, yielding a maximum possible delay value for the gate.

5. The method of claim 1, wherein the step of adjusting the gate delay value further includes the step of adjusting a gate delay value of a second gate of the gate-level circuit representation to be a maximum possible delay value for the second gate that can result from retiming.

6. The method of claim 1, wherein the step of adjusting the maximum clock period value further includes the step of subtracting, from the maximum clock period value, a set-up time for a preferred flip-flop to be used for all registers in the circuit representation.

7. The method of claim 1, wherein the step of adjusting the maximum clock period value includes the step of subtracting a maximum possible clock-to-state delay for all nets in the gate-level circuit representation.

8. The method of claim 1, wherein the step of adjusting the maximum clock period value includes the step of subtracting an averaged clock-to-state delay for all nets in the gate-level circuit representation.

9. The method of claim 1, further including the step of determining a preferred flip-flop to use for all registers in the circuit representation in accordance with the following order of priority:

a flip-flop having a shortest set-up time, a flip-flop having a shortest clock-to-state delay that meets a minimum load driving requirement, a flip-flop having a smallest load on its input pins, and a flip-flop having a smallest number of total pins.

10. A method of preparing for retiming a gate-level circuit representation stored in a memory and having a plurality of gates and a plurality of registers, the method comprising the steps, performed by a processor of a data processing system, of:

for each of the plurality of gates, shorting the registers on a fanout path of the gate to create a register-shorted fanout path for the gate;

sending each of the plurality of gates, with its register-shorted fanout path, to a timing element, which determines an adjusted gate delay value for the gate with its register-shorted fanout path; and for each of the plurality of gates, storing the adjusted gate delay value for the gate in the memory in association with the gate.

11. The method of claim 10, further comprising the step of retiming the circuit representation in accordance with the adjusted gate delay values of the plurality of gates.

12. The method of claim 10, further including the steps of determining a preferred flip-flop to use for each of the plurality of registers in a library representation; and adjusting a maximum clock period value of the circuit representation by subtracting a set-up time for the preferred flip-flop and by subtracting a possible clock-to-state delay for the register of the gate-level circuit representation.

13. The method of claim 12, wherein the step of determining a preferred flip-flop further including the step of determining a preferred flip-flop to use for each of the plurality of registers in the library representation in accordance with the following order of priority:

a flip-flop having a shortest set-up time, a flip-flop having a shortest clock-to-state delay that meets a minimum load driving requirement, a flip-flop having a smallest load on its input pins, and a flip-flop having a smallest number of total pins.

14. A method of preparing for retiming a gate-level circuit representation stored in a memory and having a plurality of gates, a plurality of registers, and a plurality of nets and having a maximum clock period value associated therewith, the method comprising the steps, performed by a processor of a data processing system, of:

for each of the plurality of nets in the gate-level circuit, determining a worst case clock-to-state delay value for the net;

determining an adjusted clock-to-state delay value for the circuit representation in accordance with the worst case clock-to-state delay value of each of the plurality of nets; and subtracting from the maximum clock period value the adjusted clock-to-state delay value for the circuit representation to yield an adjusted clock period value.

15. The method of claim 14, further comprising the step of retiming the circuit representation in accordance with the adjusted clock period value.

16. The method of claim 14, further comprising the steps of:

determining a preferred flip-flop to use for all of the plurality of registers in the circuit representation; and subtracting from the adjusted clock period value the set-up time of the preferred flip-flop.

17. The method of claim 16, wherein the step of determining a preferred flip-flop includes the step of determining a preferred flip-flop to use for all registers in the circuit representation in accordance with the following order of priority:

a flip-flop having a shortest set-up time, a flip-flop having a shortest clock-to-state delay that meets a minimum load driving requirement, a flip-flop having a smallest load on its input pins, and a flip-flop having a smallest number of total pins.

18. The method of claim 14, wherein the step of determining an adjusted clock-to-state delay value includes the step of determining an adjusted clock-to-state delay value for the circuit representation by selecting the largest next-state delay value of the plurality of nets.

19. The method of claim 14, wherein the step of determining an adjusted clock-to-state delay value includes the step of determining an adjusted clock-to-state delay value for the circuit representation by averaging the next-state delay values of each of the plurality of nets.

20. A circuit representation stored in a memory of a data processing system, comprising:

a plurality of gates and a plurality of registers connected by a plurality of nets, forming a gate-level circuit representation;

an adjusted maximum clock period value associated with the gate-level circuit representation, where the maximum clock period is found by subtracting a clock-to-state delay value in accordance with a clock-to-state delay of each of the plurality of nets; and a gate delay value for each of the plurality of gates, the gate delay value representing a maximum delay when the plurality of registers are moved during retiming, wherein the plurality of gates have the same gate delay value.

* * * * *